(12) United States Patent
Van De Kerkhof et al.

(10) Patent No.: US 8,547,522 B2
(45) Date of Patent: Oct. 1, 2013

(54) DEDICATED METROLOGY STAGE FOR LITHOGRAPHY APPLICATIONS

(75) Inventors: Marcus Adrianus Van De Kerkhof, Helmond (NL); Harald Petrus Cornelis Vos, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 603 days.

(21) Appl. No.: 12/634,329

(22) Filed: Dec. 9, 2009

(65) Prior Publication Data
US 2010/0149507 A1 Jun. 17, 2010

Related U.S. Application Data

(63) Continuation-in-part of application No. 11/362,280, filed on Feb. 27, 2006, now abandoned.

(60) Provisional application No. 60/657,710, filed on Mar. 3, 2005.

(51) Int. Cl.
*G03B 27/42* (2006.01)
*G03B 27/52* (2006.01)

(52) U.S. Cl.
USPC .............................................. 355/53; 355/55

(58) Field of Classification Search
CPC ............ G03F 7/70591; G03F 7/70706; G03F 7/70716; G03F 7/7085
USPC .................. 355/30, 53, 55, 67, 72; 356/500, 356/508, 512
See application file for complete search history.

(56) References Cited

U.S. PATENT DOCUMENTS

| 4,465,368 A | 8/1984 | Matsuura et al. |
| 4,585,342 A | 4/1986 | Lin et al. |
| 4,669,885 A | 6/1987 | Ina |
| 4,855,792 A | 8/1989 | Holbrook et al. |
| 5,631,731 A | 5/1997 | Sogard |

(Continued)

FOREIGN PATENT DOCUMENTS

| EP | 1 041 357 A1 | 10/2000 |
| EP | 1 426 826 A2 | 6/2004 |

(Continued)

OTHER PUBLICATIONS

Final Rejection mailed Jun. 9, 2009 for U.S. Appl. No. 11/362,280, filed Feb. 27, 2006; 30 pages.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A system and method are used to detect parameters regarding an exposure portion or an exposure beam. The system comprising a substrate stage and a metrology stage. The substrate stage is configured to position a substrate to receive an exposure beam from an exposure portion of a lithography system. The metrology stage has a sensor system thereon that is configured to detected parameters of the exposure system or the exposure beam. In one example, the system is within a lithography system, which further comprises an illumination system, a patterning device, and a projection system. The patterning device patterns a beam of radiation from the illumination system. The projection system, which is located within the exposure portion, projects that pattered beam onto the substrate or the sensor system.

10 Claims, 7 Drawing Sheets

(56) References Cited

U.S. PATENT DOCUMENTS

| | | | |
|---|---|---|---|
| 5,841,520 A | 11/1998 | Taniguchi | |
| 5,866,935 A | 2/1999 | Sogard | |
| 6,088,080 A | 7/2000 | Itoh | |
| 6,115,107 A * | 9/2000 | Nishi | 355/68 |
| 6,310,679 B1 | 10/2001 | Shiraishi | |
| 6,490,031 B1 | 12/2002 | Goldstein et al. | |
| 6,897,963 B1 * | 5/2005 | Taniguchi et al. | 356/500 |
| 6,914,665 B2 * | 7/2005 | Ishikawa | 355/53 |
| 6,975,387 B2 | 12/2005 | Mizuno | |
| 7,027,079 B2 | 4/2006 | Akamatsu | |
| 7,126,689 B2 | 10/2006 | Nishi | |
| 7,133,119 B1 | 11/2006 | Pettibone et al. | |
| 7,286,245 B2 | 10/2007 | Wegmann et al. | |
| 7,408,631 B2 | 8/2008 | Arnz et al. | |
| 7,456,929 B2 * | 11/2008 | Shibuta | 355/53 |
| 2003/0011786 A1 | 1/2003 | Levy et al. | |
| 2003/0137654 A1 * | 7/2003 | Mizuno | 356/121 |
| 2004/0021854 A1 | 2/2004 | Hikima | |
| 2004/0114150 A1 | 6/2004 | Wegmann et al. | |
| 2005/0200815 A1 | 9/2005 | Akamatsu | |
| 2005/0255624 A1 * | 11/2005 | Miyajima | 438/48 |
| 2006/0132733 A1 * | 6/2006 | Modderman | 355/53 |
| 2006/0219947 A1 | 10/2006 | Van De Kerkhof et al. | |
| 2007/0252963 A1 * | 11/2007 | Modderman et al. | 355/53 |
| 2007/0263191 A1 | 11/2007 | Shibazaki | |
| 2008/0008843 A1 | 1/2008 | Ratel | |
| 2008/0043212 A1 | 2/2008 | Shibazaki | |

FOREIGN PATENT DOCUMENTS

| | | | |
|---|---|---|---|
| JP | 8-22953 A | | 1/1996 |
| JP | 11135400 A | * | 5/1999 |
| JP | 2000-121498 A | | 4/2000 |
| JP | 2000-164504 A | | 6/2000 |
| JP | 2000-205946 A | | 7/2000 |
| JP | 2001-237164 A | | 8/2001 |
| JP | 2001-308003 A | | 11/2001 |
| JP | 2002-175963 A | | 6/2002 |
| JP | 2002-246287 A | | 8/2002 |
| JP | 2003-218024 A | | 7/2003 |
| JP | 2003-338989 A | | 11/2003 |
| JP | 2004-061515 A | | 2/2004 |
| JP | 2004-186234 A | | 7/2004 |
| WO | WO 99/23692 A1 | | 5/1999 |
| WO | WO 02/09163 A1 | | 1/2002 |
| WO | WO 02/29495 A1 | | 4/2002 |
| WO | WO 02/52620 A1 | | 7/2002 |
| WO | WO 2005/015313 A1 | | 2/2005 |

OTHER PUBLICATIONS

European Patent Office Communication directed to related EP Patent Application No. 06 251 118.3, European Patent Office, Munich, Germany, dated Mar. 25, 2011; 6 pages.

Notice of Reasons for Rejection for Japanese Patent Application No. 2006-055668 mailed Jul. 17, 2009, 4 pgs.

European Search Report and Written Opinion for Application No. 06251118.3-2222 mailed Aug. 22, 2006, 8 pgs.

Search Report, date mailed May 29, 2007, for Australian Application No. SG 200601339-5, 8 pgs.

Non-Final Rejection mailed Jan. 24, 2008 for U.S. Appl. No. 11/362,280, 14 pgs.

Final Rejection mailed Jul. 3, 2008 for U.S. Appl. No. 11/362,280, 16 pgs.

Second Non-Final Rejection mailed Nov. 28, 2008 for U.S. Appl. No. 11/362,280, 27 pgs.

* cited by examiner

US 8,547,522 B2

DEDICATED METROLOGY STAGE FOR LITHOGRAPHY APPLICATIONS

CROSS REFERENCE TO RELATED APPLICATIONS

This application is a continuation-in-part of U.S. patent application Ser. No. 11/362,280 to Van De Kerkhof et al., entitled "Dedicated Metrology Stage for Lithography Applications" and filed Feb. 27, 2006 (now abandoned), which claims priority under 35 U.S.C. §119(e) to U.S. Provisional Patent Application No. 60/657,710, filed Mar. 3, 2005, all of which are incorporated by reference herein in their entirety.

BACKGROUND

1. Field of the Invention

The present invention is related to measurement of lithographic exposure system parameters, and more particularly, to a dedicated metrology stage for lithography applications.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art would recognize that the description herein would also apply to other types of substrates.

During lithography, a wafer, which is disposed on a wafer stage, is exposed to an image projected onto the surface of the wafer by an exposure system located within a lithography system. The exposure system includes a reticle (also called a mask) for projecting the image onto the wafer.

The reticle is generally located between a semiconductor chip and a light source, usually mounted on a reticle stage. In photolithography, the reticle is used as a photo mask for printing a circuit on a semiconductor chip, for example. Lithography light shines through the mask and then through a series of optical lenses that shrink the image. This small image is then projected onto the silicon or semiconductor wafer. The process is similar to how a camera bends light to form an image on film. The light plays an integral role in the lithographic process. For example, in the manufacture of microprocessors, the key to creating more powerful microprocessors is the light's wavelength. The shorter the wavelength, the more transistors can be etched onto the silicon wafer. A silicon wafer with many transistors results in a more powerful microprocessor.

A relatively common problem in the lithographic art is a need to measure parameters of the optical systems used for lithographic exposure. As a general rule, it is desirable to be able to do such measurements without taking the lithographic exposure system offline, and without disassembly and reassembly of components. The current practice in the industry is to place sensors on the wafer stage, to the extent space permits. These sensors are generally located in the space not occupied by the wafer itself, in the corners of the wafer stage.

However, with the ever increasing sophistication of exposure systems, with decreasing exposure wavelengths, and with increasing complexity of the optics, the number of different sensors that end users require is increasing. At the same time, there are severe constraints on the available space. For example, it is generally impractical or undesirable to increase the dimensions of the wafer stage, since this complicates stage positioning, and stage movement, and increases the dimensions of the overall lithographic equipment, which is problematic, since clean room space inside a fabrication facility is limited.

Accordingly, what is needed is a way to enable positioning of measurement sensors of lithographic exposure optics without affecting overall lithographic tool dimensions.

SUMMARY

In one embodiment of the present invention there is provided a system comprising a substrate stage and a metrology stage. The substrate stage is configured to position a substrate to receive an exposure beam from an exposure portion of a lithography system. The metrology stage has a sensor system thereon that is configured to detected parameters of the exposure system or the exposure beam.

In another embodiment of the present invention, the system is within a lithography system, which further comprises an illumination system, a patterning device, and a projection system. The patterning device patterns a beam of radiation from the illumination system. The projection system, which is located within the exposure portion, projects that pattered beam onto the substrate or the sensor system.

In a further embodiment of the present invention, there is provided a method of measuring optical parameters of an exposure portion of a lithography system comprising the following steps. Moving a substrate stage away from an optical axis of the exposure portion. Moving a metrology stage to locate a sensor in the optical axis. Measuring an optical parameter of the exposure system.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

One or more embodiments of the present invention will now be described with reference to the accompanying drawings. In the drawings, like reference numbers can indicate identical or functionally similar elements. Additionally, the

DETAILED DESCRIPTION

Figure 1:
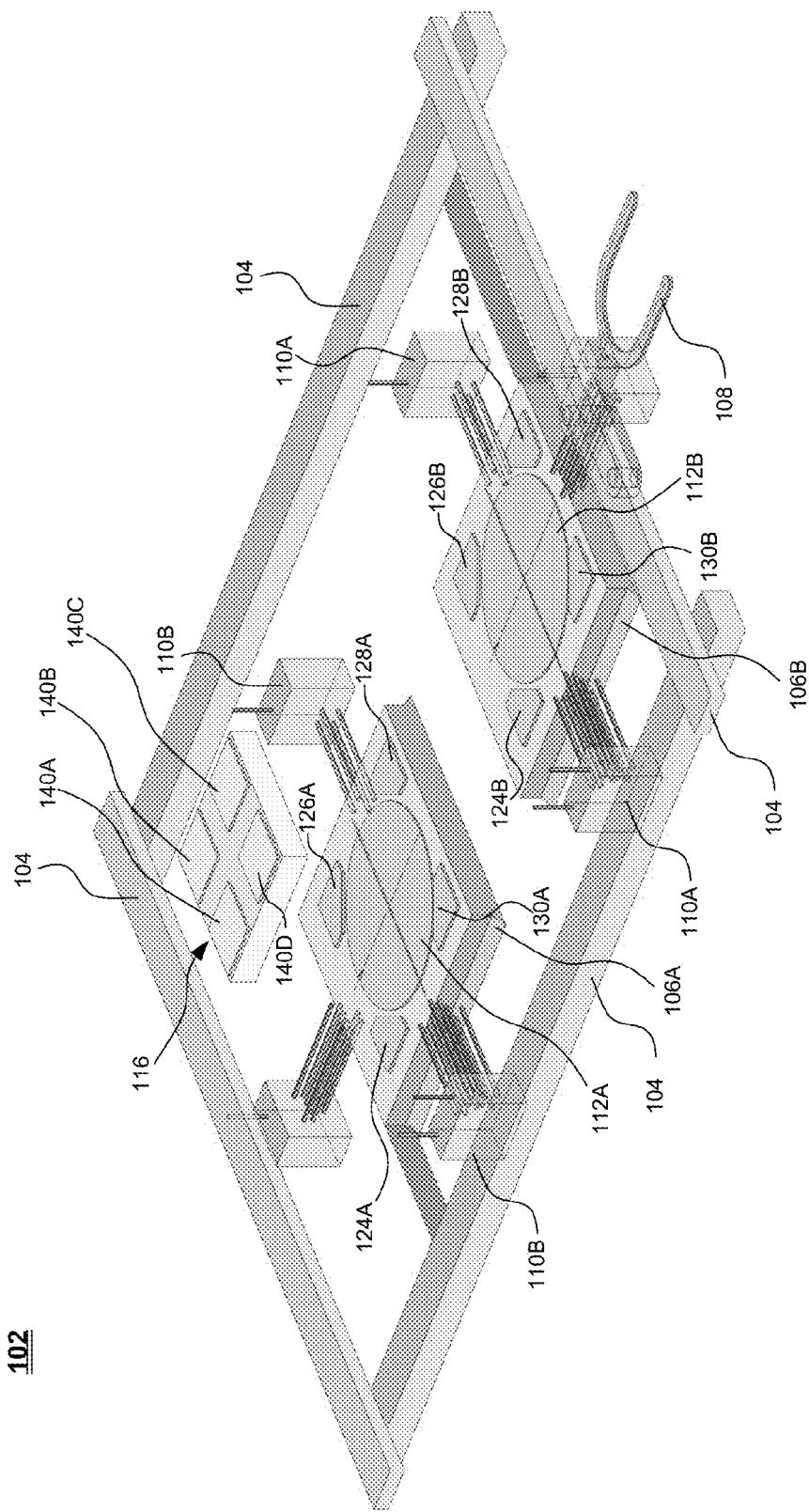
FIG. 1 illustrates a metrology stage, according to one embodiment of the present invention.

FIG. 1 illustrates one embodiment of the present invention. Shown in FIG. 1 is an isometric three-dimensional view of a substrate handling mechanism 102 of an exposure apparatus (the remainder of the exposure apparatus, such as projection optics, reticle stage, illumination source, etc. are not shown for clarity in FIG. 1, but see discussion below relating to FIG. 2). The substrate handling apparatus 102 has a frame 104, portions of which are shown in FIG. 1. A robot arm 108, or a similar mechanism, is used to move substrates 112 in and out of the substrate handling apparatus 102. Two substrate stages, in this case, labeled 106A and 106B, are located within the substrate handling apparatus 102. The substrate stages 106A, 106B have substrates 112A, 112B located thereon. In alternative examples, the substrates being exposed can be semiconductor wafers or flat panel display (FPD) substrates. Typical dimensions of the substrate stages 106A, 106B is slightly larger than the substrate 112 itself. For current state-of-the-art 12-inch diameter substrates, the substrate stages can be roughly square and on the order of about 13-14 inches in size. In a two-substrate-stage system, one of the substrate stages is typically used for exposure, while the other one is used for measuring of exposure results (for example, measurement of post-process substrate surface height, etc.).

Each substrate stage 106A, 106B has a corresponding actuating system 110A, 110B for moving the substrate stage 106A, 106B. The substrate stages 106A, 106B can have corresponding sensors mounted thereon, designated 124A-130A for substrate stage 106A, and 124B-130B for substrate stage 106B. In one example, that the location of the sensors 124-130 is in the corners of the substrate stages 106, since the substrate 112 is normally in the center of the substrate stage 106.

Also shown in FIG. 1 is a metrology stage 116, which includes sensors 140A, 140B, 140C and 140D for measurement of optical parameters. It will be understood that the number of sensors 140 on the metrology stage 116 is not particularly limited, although typically the overall dimensions of the metrology stage 116 will be smaller than the dimensions of the substrate stages 106.

In one example, the vertical dimension of the sensors 124-130 placed on the substrate stages 106 may be limited for various reasons. For example, the minimum height of the substrate stage 106 and the location of the lowest element of the projection optics (not shown in the figure) can limit the vertical dimensions of the sensors 124-130 on the substrate stage 106. In one example, with respect to the metrology stage 116, since the metrology stage 116 can be "thinner" than the substrate stage 106, the sensors 140 can be "taller" than the sensors 124-130. Also, in one example, the substrate stages 106 can be made smaller in the X-Y (horizontal) dimension (for example, the "corners" can be "cut off," resulting in a "footprint" of the substrate stage that is smaller than the roughly square shape shown in FIG. 1), realizing space savings.

Figure 2:
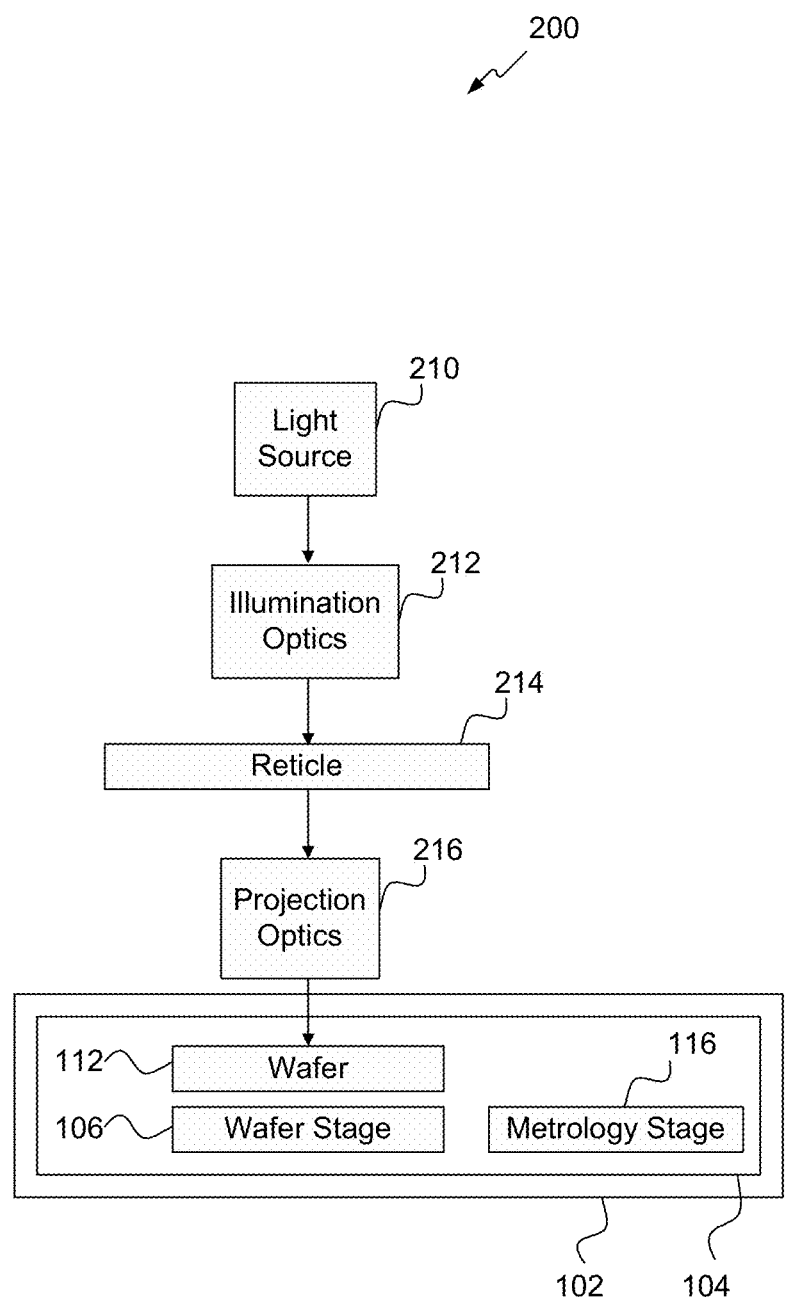
FIG. 2 schematically illustrates an exemplary lithographic system according to one embodiment of the present invention, which uses the metrology stage.

FIG. 2 schematically illustrates an exemplary lithographic system 200 according to one embodiment of the present invention, which uses the metrology stage 116. As shown in FIG. 2, the lithographic system 200 (shown in side view) includes a light source (illumination source) 210, such as a laser or a lamp, illumination optics 212 (such as a condenser lens), and a patterning device (e.g., reticle, mask, spatial light modulator, etc., hereinafter reticle will be used) 214, which is usually mounted on a patterning device stage (not shown). Note that the reticle 214 can be a plate with an exposure pattern on it. In an alternative example, the reticle can be replaced with a dynamic patterning device, such as an array of programmable elements or a spatial light modulator array, such as used in maskless lithography. Light from the reticle 214 is imaged onto the substrate 112 using projection optics 216. The substrate 112 is mounted on the substrate stage 106 (only one of the two substrate stages is shown in this figure, as the invention is not limited to any particular number of substrate stages). Also shown in FIG. 2 is the housing 104 (which can enclose only the substrate stage 106 and the metrology stage 116, or can enclose other components illustrated in the figure).

In one example, the sensors 140 (see FIG. 1) can include a polarization sensor, which is particularly useful for measurement of time-varying polarization (absolute and relative) properties of the projection optics. The polarization sensor is one sensor where the ability to install sensors that have a substantial height becomes particularly important.

Figure 3:
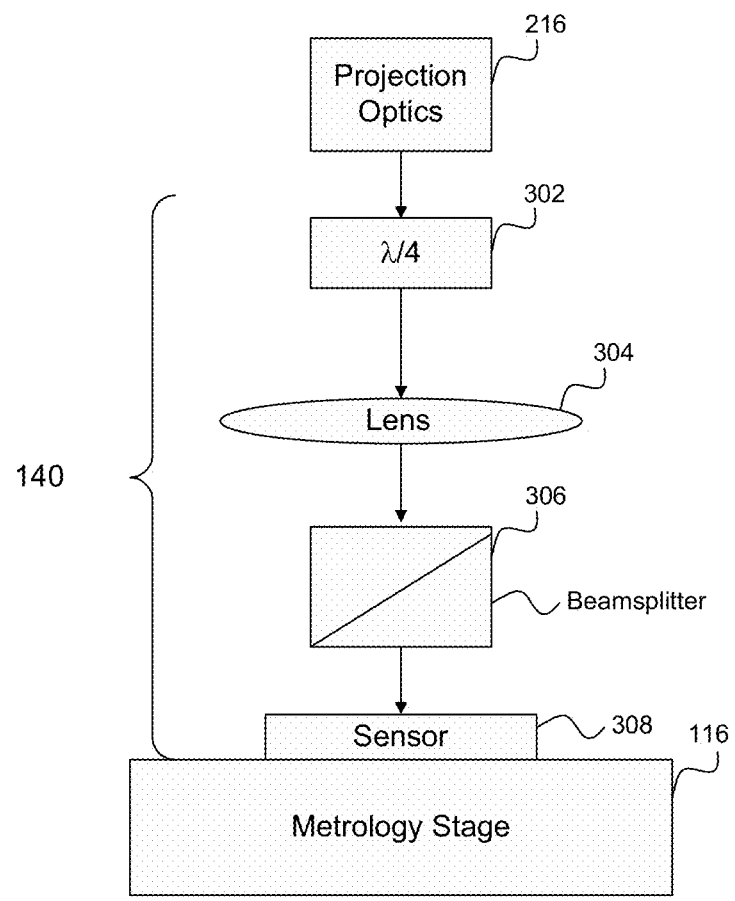
FIG. 3 shows an exemplary polarization sensor that can be used in the system of FIG. 2, according to one embodiment of the present invention.

FIG. 3 shows an exemplary polarization sensor that can be used in the system of FIG. 2, according to one embodiment of the present invention. The polarization sensor includes a quarter wavelength plate 302, a collimator lens 304, a polarizer 306, a detector 308, and a mechanism for rotating the quarter wavelength plate 302.

The polarizer (analyzer) 306 is located downstream of the projection optics 216 and positioned in the optical path. The polarizer 306 passes one particular polarization of the incoming light that can then be measured in the metrology stage 116. Examples of polarizers can be such optical components as polarizing plates, polarizing beam splitters, etc. Such optical components are frequently relatively volume-intensive, for example, on the order of several cubic centimeters. Furthermore, such optical components are usually very limited in angular range (i.e., in terms of angle of incidence), usually on the order of less than 1 degree, and frequently substantially less than 1 degree. At the same time, the projection optics 216 is typically a high numerical aperture lens, or set of lenses, which is mismatched to the very small angular range of the optical components, such as polarizing beamsplitters.

In one example, in order to use such a polarizer 306, it is necessary to shape the beam appropriately. In one example, such shaping is done by means of a collimator lens 304 (or set of lenses). The collimator lens 304 is also relatively difficult to miniaturize, and often has a volume of several cubic centimeters. Furthermore, it is frequently desirable to measure not just one polarization, but a range of polarizations. To accomplish this, in one example the entire polarization sensor needs to be rotated, while in another example a quarter wavelength plate 302 can be inserted into the beam path (for example, between the collimator lens 304 and projection optics 216) and can then be rotated to select the appropriate polarization. A detector 308, for example a charged coupled device (CCD) array (or a photodiode), is positioned such that the detector 308 is at the proper focus and is aligned in the X-Y plane (note that this is an imaging measurement, and it is important to properly position the detector).

From the description above, it can be seen that the entire polarization sensor, including the quarter wavelength plate 302, collimator lens 304, polarizer 306, CCD array 308, and a mechanism for rotating the quarter wavelength plate 302, occupies relatively large volume. For example, this volume can be on the order of several cubic centimeters, which given the "cramped" dimensions available to the designer of the lithographic tool, makes it relatively impractical to use such polarization sensors, if they need to be mounted on conventional substrate stages. However, since the metrology stage 116 can be made thinner, the polarization sensor, an example of which is described above, can be installed on the metrology stage 116.

Figure 5:
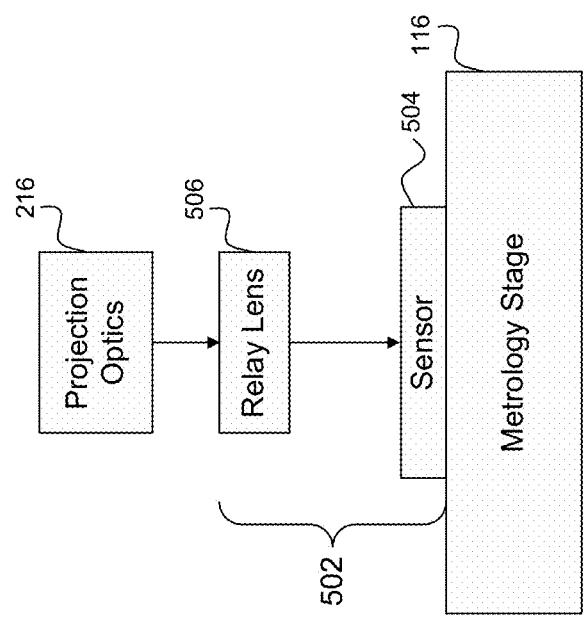
FIG. 5 shows an apodization sensor in the sensors, according to one embodiment of the present invention.

FIG. 5 shows an apodization sensor 502 in the sensors 140, according to one embodiment of the present invention. The apodization sensor 502 measures the intensity of the exposure beam as a function of distance from the optical axis in the XY plane (image plane). This is also an imaging measurement. The apodization sensor 502 is another example of a sensor where vertical height requirements can make it impractical to mount such a sensor on a conventional substrate stage. In one example, the apodization sensor 502 includes a CCD array 504 that "looks" into the pupil of the projection optics 216. Generally, the CCD array 504 needs to be optically conjugate with the pupil of the projection optics 216. This requires the use of a relay lens 506 between the charge coupled device 504 and the projection optics 216. In one example, the relay lens 504 has a dimension on the order of several millimeters or even a few centimeters. Thus, mounting such an apodization sensor 502 on a conventional substrate stage is extremely difficult.

In one example, a CCD array 504 for an apodization sensor 502 measures the light intensity in the image plane as a function of (X,Y) and is at least the size of the exposure field in the image plane. In one example, an exposure field is several tens of millimeters by several millimeters in size and on the order of about 26 millimeters by 10 millimeters in size (although the exposure field in many state of the art lithography tools is generally increasing in size over time). Thus, the CCD array 504 is at least as large, or somewhat larger, in size, as the exposure field.

In one example, the apodization sensor 502 can be used to verify the numerical aperture of the system. Such a measurement may be desired by the end user to confirm that the system performs to specification, i.e., works "as advertised." It should be noted that the numerical aperture measurement is a one-time (or, at most, relatively rare) measurement, compared to many other measurements that need to be performed much more frequently.

Figure 4:
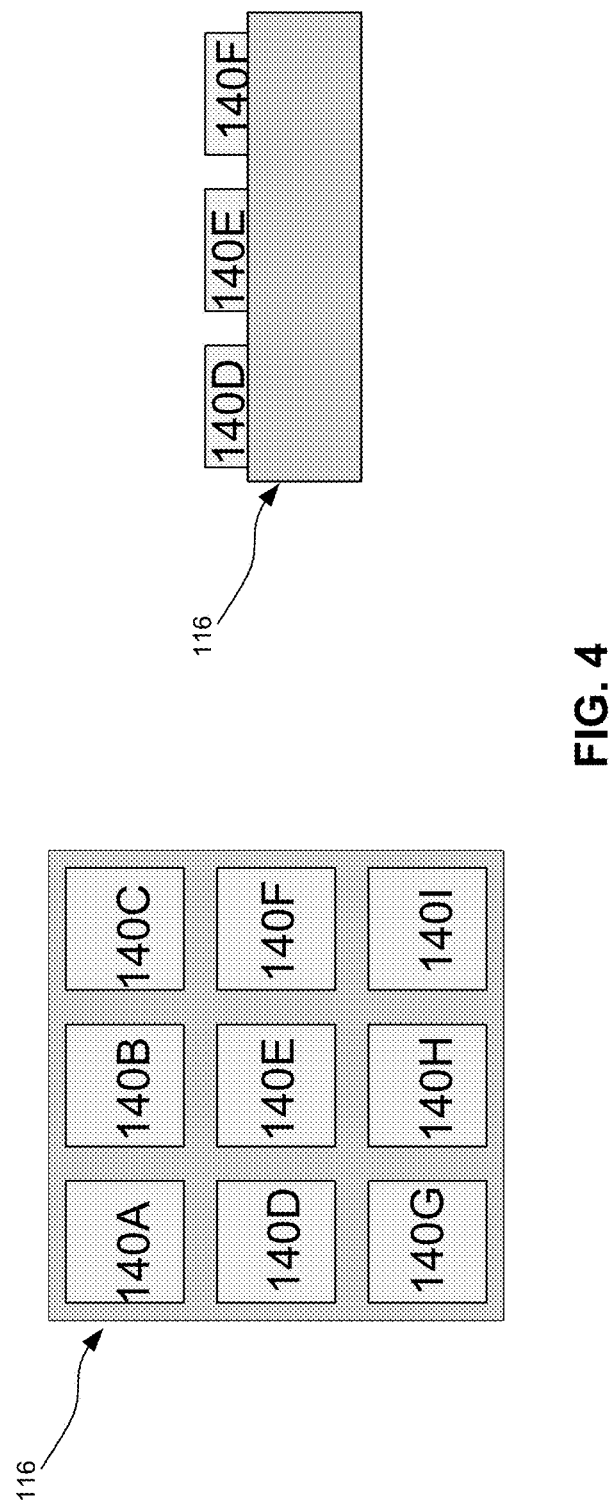
FIG. 4 shows an exemplary arrangement of sensors on the metrology stage.

FIG. 4 shows an exemplary arrangement of sensors on the metrology stage (with the top view and side view shown). In this case, nine sensors 140A-140I are shown in a grid pattern arrangement. Any of the sensors discussed above or below can be one of these nine sensors 140A-140I, having the arrangement and structures as described, which are not shown for convenience.

In one example, the sensors 140A-140I can include a sensor to measure slit uniformity, if slits are used in the lithographic optics. This is a measure of illumination source quality. A typical high-end lithographic system, as noted above, exposes an area on a substrate that is several tens of millimeters by several millimeters in size, depending on the manufacturer of the lithographic system, for example, about 26 millimeters by 10 millimeters. For nomenclature purposes, the 26 millimeter dimension is usually referred to as "X," and the 10 millimeter dimension is usually referred to as "Y." Ideally, the optical system is able to image a perfect "rectangle" that has an intensity distribution that is uniform throughout the rectangle. A slit uniformity sensor is designed to measure whether the "uniform rectangle" that is imaged is in fact uniform, and if not, how far it deviates from uniformity. This can be accomplished, for example, through the use of a integrating precision photodiode that is scanned in the Y direction. The photodiode can have a pinhole, or a slit, "on top" of it, to limit the amount of light that reaches the photodiode.

It should also be noted that a charged couple device normally cannot be used for this purpose, because most CCDs drift over time. What is of primary interest in the slit uniformity measurement is absolute values of intensity (in addition to relative intensity as a function of X,Y distance), since it is important to accurately relate the voltage from the photodiode to the amount of light received by the photoresist. Note also that the use of a precision photodiode permits a better signal-to-noise ratio. The photodiode provides an integration of the received light in the Y direction, either by moving the photodiode or by integrating using a slit.

In one example, the sensors 140A-140I can include a wavefront sensor to measure the quality of the wavefront image, as well as any aberrations. An example of such a wavefront sensor is an ILIAS sensor (Inline Lens Interferometric System) to measure the quality of the wavefront. It should be noted that although ILIAS sensors have been used in the past, one problem with such sensors in conventional systems is the need to measure the "far field" due to the lack of space for a relay lens, or a collimator lens. As discussed above, the ILIAS sensor can include such a relay and/or collimator lens, to substantially improve performance of the ILIAS sensor, and therefore, of the measurement of the quality of the wave front and the aberrations.

In one example, the sensors 140A-140I can include a sensor to measure image contrast. The contrast sensor measures the quantity $$\frac{\text{Maximum Intensity} - \text{Minimum Intensity}}{\text{Maximum Intensity} + \text{Minimum Intensity}}$$

in the image plane. One way to implement the contrast sensor is to have slits on the reticle, with the slits arranged to have a certain pitch. One photodetector, or one single photodetector per pitch can be used in the image plane. With perfect contrast, the slits in the reticle (in the object plane) will form "lines of light" in the image plane and perfectly dark areas outside of the lines of light. In practice, this may be unachievable and there is always some signal that will be measured even in the "dark areas." The contrast sensor therefore provides a measurement of the relative intensity between the light areas and the dark areas.

Figure 6:
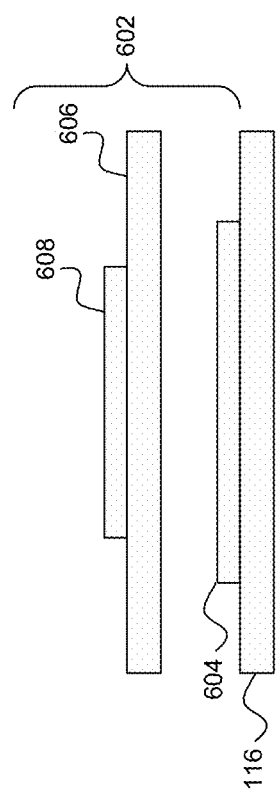
FIGS. 6 and 7 show a stray light sensor in the sensors, according to one embodiment of the present invention.
Figure 7:
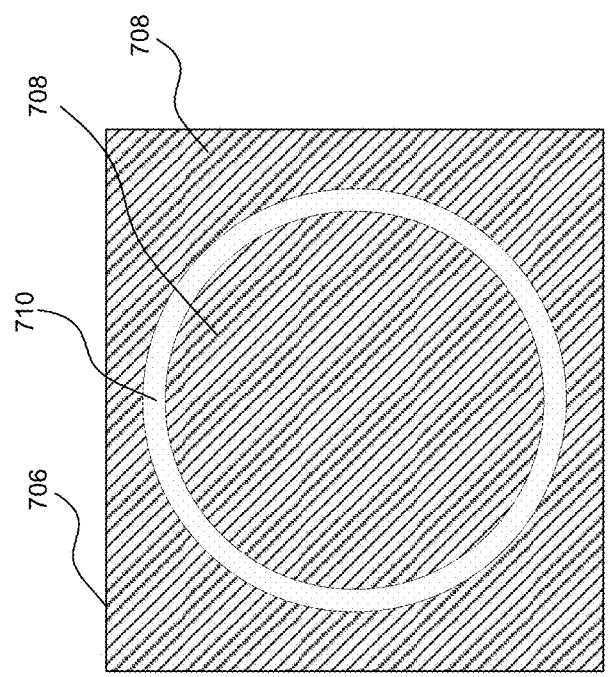

FIGS. 6 and 7 show a stray light sensor 602 in the sensors 140A-140I, according to one embodiment of the present invention. FIG. 7 shows an alternative embodiment of the plate portion 706 of sensor 602, according to one embodiment of the present invention. Sensor 602 can measure stray light (which can be due to contamination of the optics). The stray light sensor 602 essentially measures intensity in the image plane as a function of radial distance from the optical axis. In one example, this is done by creating a point source in the object plane, in other words, the reticle functions as a point source, rather than as a mask for exposure. Ideally, the point source images into a point in the image plane. The stray light sensor 602 can also include a transmissive glass plate 606 with chrome 608 (or other metal) blocking the light from the point source. The glass plate 606 is positioned in the image plane. A detector 604, for example, as a photo detector or a CCD array is positioned below the glass plate. The detector can also be an integrating photodiode.

In the example shown in FIG. 7, in addition to the central portion having chrome 708 blocking the light from the point source, a ring shaped annulus 710 is left open, with the remaining portion of the glass plate 706 also covered by chrome or metal 708. Thus, the sensor 602 measures the amount of light received at a distance r (i.e., I(r)) from the optical axis, which, with the point source blocked, represents stray light. Different glass plates, with different radii of the annulus can be used to "step through" the various distances r. It will be appreciated that other arrangements of sources in the object plane, detectors and blocking elements (like glass plates) are possible.

In one example, the sensors 140A-140I can include a focus sensor, to sense the location of the focus (image) plane in the vertical direction. The focus sensor is typically a photodiode that is initially placed at the expected location of the focus, and light intensity is measured. The photodiode is then moved in three degrees of freedom (X, Y and Z) to locate the maximum, which is then taken to be the location of the focus.

In one example, the sensors 140A-140I can include a sensor to measure alignment of the reticle, functioning in a manner similar to the focus sensor (to find the maximum intensity at a point of alignment).

Throughput is a critical performance driver in current semiconductor manufacturing processes. Use of a dedicated metrology stage as described above can diminish throughput when measurements are made in a serial fashion. That is, in one approach to using the dedicated metrology stage, either substrate stage 106 is located underneath the projection lens so as to expose wafers, or metrology stage 116 is located underneath the projection lens, but not both. Further to the penalty imposed by the serial nature of these measurements, there is a time penalty resulting from the need to swap substrate stage 106 with metrology stage 116, and vice versa. In addition, there are different volume requirements imposed on sensors that can be located on substrate stage 106 versus the more relaxed volume requirements imposed on sensors that can be located on metrology stage 116. Such volume requirements can result, for example, in the height of metrology stage 116 being less than the height of substrate stage 106. Alternatively, where the height of metrology stage 116 and the height of substrate stage 106 are similar, certain sensors with substantial size requirements are precluded from being located on substrate stage 106.

In accordance with an embodiment of the present invention, a hybrid mode of metrology is described that addresses the above throughput requirements. In an embodiment of the hybrid mode, sensors, such as sensors 140, are divided into two sets. The first set of sensors includes those sensors that provide relatively rapid measurements with modest accuracy, while a second set of sensors includes those sensors providing more accurate measurements, albeit more slowly. Thus, more frequently needed measurements of relevant imaging parameters are made using the first set of sensors located on substrate stage 106, while less frequently needed measurements are made using the second set of sensors 140 located on metrology stage 116. In this embodiment, the metrology stage sensors and associated measurements are typically more accurate and offer better repeatability than substrate stage sensors, since less of a compromise is required between the available building space and environment provided to the sensors on the one hand and sensor performance on the other. Moreover, a hybrid mode speeds up the measurements on the metrology stage by shifting a portion of the measurement time needed to the first set of sensors (the faster sensors) on substrate stage 106. Thus, without any real performance sacrifice, throughput is gained in two ways, namely through less stage-swap overhead and through faster average measurements.

In addition, sensors on substrate stage 106 and their measurements may be calibrated against measurements made by corresponding sensors on metrology stage 116. Thereafter, the sensors on substrate stage 106 may be used in a relative mode. Such a calibration that permits sensor usage in a relative mode reduces an absolute accuracy requirement for the sensors. As such, the relative mode significantly improves the attractiveness of the compromise situation between sensor performance, sensor volume, environment and measurement time. Therefore, for example, a sensor can be used in relative mode on substrate stage 106, while the same type of sensor can be used in the much slower absolute mode on metrology stage 116.

In a further embodiment of the present invention, an alternative hybrid approach is to measure a first set of relevant imaging parameters using sensors located on substrate stage 106, and to measure a second set of relevant imaging parameters using sensors located on metrology stage 116. Again, the sensors on substrate stage 106 and metrology stage 116 include sensors 140. In an embodiment, the relevant imaging parameters chosen to be included in the second set of relevant imaging parameters are those that to remain constant or change very slowly over time, which means the measurements may be made on a relatively infrequent basis. Similarly, the relevant imaging parameters chosen to be included in the first set of relevant imaging parameters are those that vary more rapidly than their counterparts in the second set of relevant imaging parameters. In a further variation on this approach, when correlations are established between parameters measured on substrate stage 106 and parameters measured on metrology stage 116, these parameters may be measured using sensors on substrate stage 106 over the working range established by the correlation. When measurements are required outside the established working range, a new working point may be established by a measurement using a sensor on metrology stage 116.

In a still further embodiment of the present invention, metrology stage 116 (including the sensors located on metrology stage 116) may be detached from close proximity to substrate stage 106. Metrology stage 116 may be stored separately from substrate stage 106. In addition, metrology stage 116 may be moved from one location to another, from one substrate stage 106 to the next, as measurement requirements dictate. In particular, moving from one location to another includes moving from one machine (or even building) to another. Following a move from one location to another, metrology stage 116 is typically actively aligned in position and orientation to the particular measurement situation prior to measurements being taken.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method of measuring optical parameters of an exposure portion of a lithography system, the method comprising:
    moving a substrate stage to locate a first sensor, the first sensor positioned on the substrate stage, in an optical axis of the exposure portion;
    measuring, by the first sensor, a first optical parameter of light from the exposure portion;
    moving the substrate stage away from the optical axis of the exposure portion;
    moving a metrology stage to locate a second sensor in the optical axis;
    measuring, by the second sensor, a second optical parameter of light from the exposure portion, and
    wherein the first optical parameter and second optical parameter are different optical parameters.

2. The method of claim 1, wherein the measuring by the first sensor takes less time than the measuring by the second sensor.

3. The method of claim 1, wherein the measuring by the first sensor provides a relative measurement.

4. The method of claim 1, wherein the measuring by the first sensor provides a relative measurement using a calibration based on the measuring by the second sensor.

5. The method of claim 1, wherein the metrology stage is movable from an immediate proximity to the substrate stage and the method further comprises:
    calibrating the first sensor prior to measuring a first optical parameter of light from the exposure portion.

6. The method of claim 1, wherein the first optical parameter comprises one of stray light, slit uniformity, apodization, relative polarization, absolute polarization, image quality, and wavefront aberration.

7. The method of claim 1, wherein the second optical parameter comprises one of stray light, slit uniformity, apodization, relative polarization, absolute polarization, image quality, and wavefront aberration.

8. A method of measuring optical parameters of an exposure portion of a lithography system, the method comprising:
    moving a substrate stage to locate a first sensor, the first sensor positioned on the substrate stage, in an optical axis of the exposure portion;
    measuring, by the first sensor, a first optical parameter of light from the exposure portion;
    moving the substrate stage away from the optical axis of the exposure portion;
    moving a metrology stage to locate a second sensor in the optical axis; and
    measuring, by the second sensor, a second optical parameter of light from the exposure portion, and
    wherein the first optical parameter varies rapidly over time and the second optical parameter varies slowly over time.

9. A method of measuring optical parameters of an exposure portion of a lithography system, the method comprising:
    moving a substrate stage to locate a first sensor, the first sensor positioned on the substrate stage, in an optical axis of the exposure portion;
    measuring, by the first sensor, a first optical parameter of light from the exposure portion;
    moving the substrate stage away from the optical axis of the exposure portion;
    moving a metrology stage to locate a second sensor in the optical axis; and
    measuring, by the second sensor, a second optical parameter of light from the exposure portion, and
    wherein the first optical parameter and second optical parameter each comprises a different optical parameter selected from the group consisting of stray light, slit uniformity, apodization, relative polarization, absolute polarization, image quality, and wavefront aberration.

10. The method of claim 9, wherein the second optical parameter remains constant or changes very slowly over time such that the measuring thereof may be made on a relatively infrequent basis compared to the measuring of the first optical parameter.

* * * * *